June 16, 1959 A. LEBLOND 2,891,160

SEMI-CONDUCTOR OSCILLATORS

Filed Jan. 2, 1957 3 Sheets-Sheet 3

United States Patent Office 2,891,160

Patented June 16, 1959

2,891,160

SEMI-CONDUCTOR OSCILLATORS

André Leblond, Paris, France, assignor to Compagnie Generale de Telegraphie Sans Fil, a corporation of France Application January 2, 1957, Serial No. 632,181

Claims priority, application France January 3, 1956

25 Claims. (Cl. 250—36)

The present invention relates to oscillator circuits utilizing semi-conductor structures.

There are various known types of semi-conductor structures, namely: P-type semi-conductors, i.e., semiconductors with an excess of positive carriers or holes; N-type semi-conductors, i.e., semi-conductors with an excess of negative carriers or electrons; and I-type or intrinsic semi-conductors, i.e., semi-conductors with substantially no impurities.

It is an object of this invention to provide a novel type of semi-conductor structure displaying, under certain conditions, a negative resistance whereby it can be used for the production of electro-magnetic oscillations in very high frequency and ultra-high frequency oscillator circuits, the provision of which is also an object of the invention.

One semi-conductor device, according to the invention is a diode comprising a semi-conductor region of the P-, or N-, type forming a junction with an I-type semiconductor region, and two external, substantially purely ohmic, metal-to-semi-conductor contacts.

According to a preferred embodiment of the invention, the selected thickness of the region I is of the order of 19 microns or less. On the other hand, the thickness of the P- or N-region is selected sufficiently large to allow the parameters of this region to be unambiguously defined.

The invention will be better understood from the following description considered in conjunction with the accompanying drawings, in which:

Fig. 1 illustrates schematically a P–I-type semi-conductor element;

Fig. 2 similarly illustrates a N–I-type semi-conductor element;

Figure 1:
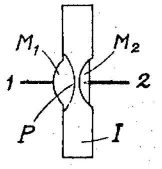
Figure 2:
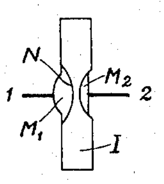

The PI- and NI-junctions respectively shown in Figures 1 and 2, may be obtained by adding indium, or antimony to a portion of one of the faces of a pure germanium or "intrinsic" plate or wafer. The opposite face of this plate is dug out for instance by electrolytic action so as to obtain an I-region of, for example, a few microns' thickness. Ohmic contacts $M_1$ and $M_2$ are then provided to which connections 1 and 2 are fit. Contact $M_2$ is obtained, for instance, by tin soldering, whereas contact $M_1$ is formed by indium or antimony, as the case may be, which act as a solder for contact 1, according to whether a PI- or a NI-junction is provided. Region P, or N, has a high impurity concentration, for instance, of the order of $10^{10}$ impurity atoms per cubic centimeter.

Figure 3:
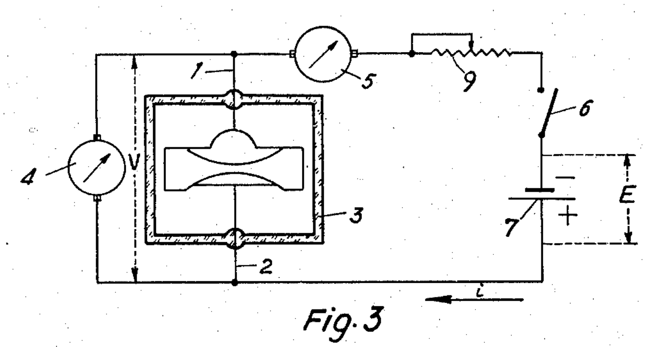
Fig. 3 shows a circuit for plotting the operation curve of semi-conductor diode.
Figure 5:
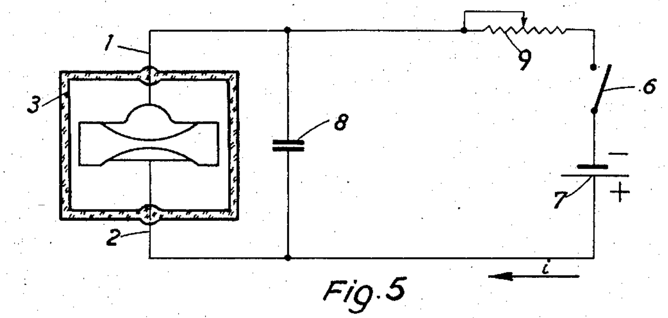
Figs. 5 and 7 illustrate oscillator circuits provided in accordance with the invention.
Figure 7:
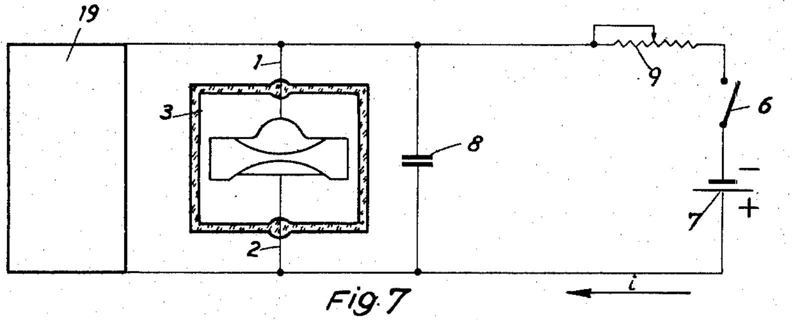

In Figs. 3, 5 and 7, the junction diode of Fig. 1 is shown in an enclosure 3 which is refrigerated, for example, to the temperature of liquid air. The junction diode being, for instance, of the P–I type, it is connected in series with an adjustable resistor 9 of value $r$ and a D.C. voltage source 7, the positive pole of which is connected to connection 2 and the negative pole of which is connected to connection 1. Fig. 3 also includes a voltmeter 4 for determining the voltage $v$ across the terminals of the diode P–I and a milli-ammeter 5 for determining the current $i$ flowing in the reverse direction, i.e., in the direction of the arrow, the diode being biased in this direction by battery 7 having a voltage E, as shown.

Figure 4:
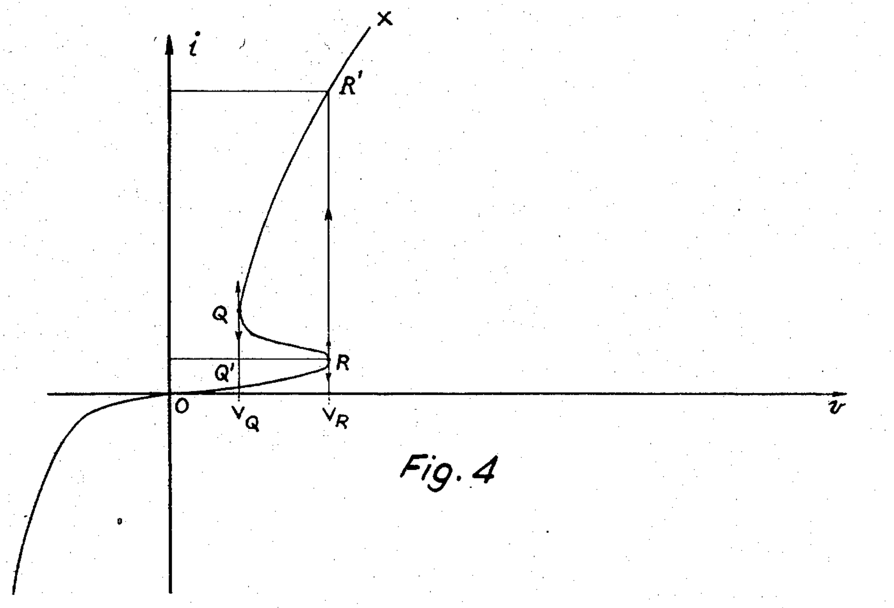

Experience shows that upon the closing of a switch 6 provided in the circuit of Fig. 3, and by adjustment of the value of the resistance 9, the voltage $v=E-ri$ across the terminals of the semi-conductor element first increases as a function of current $i$. If $v$ is plotted along the abscissae and $i$ along the ordinates, the operating point moves along a characteristic curve as shown in Fig. 4, until a point R is reached. The slope of the curve is then reversed to become negative until a point Q is reached where the slope of curve reverses. While $v$ increases as a function of $i$ before the operating point reaches R and after it has passed point Q, it varies as an inverse function of $i$ between R and Q, i.e. the resistance of the diode is negative within the zone RQ.

The shape of the characteristic curve of Fig. 4, which may also be derived through calculation, is a remarkable feature of the semi-conductor diode provided by the invention, whether this element is a P–I or a N–I diode.

Experience shows that, with a sufficiently low value of the resistance $r$ and with a capacity of sufficiently high value connected between the terminals of the semi-conductor, the representative point of the semi-conductor, in the $v$—$i$ diagram, first follows the branch OR. At the time of arriving at R the representative point jumps suddenly from R to R′, this point being located on the upper positive branch QX of the curve. Then the representative point describes the portion R′Q of the upper branch of the characteristic curve. At the point Q, a second jump occurs from Q to Q′. Finally the point describes Q′R and upon arriving at R the preceding cycle starts again.

This behavior of the semi-conductor diode makes it possible to use the same as an oscillator. A simple oscillator circuit is shown in Fig. 5. It comprises a capacitor 8 connected in parallel across the semi-conductor diode. Oscillations may be collected either across the terminals of the capacitor 8 or across the resistor 9, the fundamental frequency of these oscillations being adjustable by adjusting the resistance $r$ and/or the capacitance of 8. Values as high as 35 mc. have been reached.

While applicant believes that the following provides a satisfactory explanation of the way in which the oscillator circuit according to the invention operates, he does not wish to be bound thereby, as the ultilisation of the circuit is not dependent upon such explanation. When switch 6 is closed, if voltage $v$ is selected to have such a value that the operating point is located in the unstable region RQ, high-frequency oscillations are produced and the operating point describes the cycle RR′QQ′R, which corresponds to successive charges and discharges of capacitor 8, at the rhythm of the high frequency oscillations.

It appears that the sudden increase of current $i$ from R to R′ is a consequence of the gradual ionization of the intrinsic region of the semi-conductor. The ionization would appear to start only when voltage $v$ has reached a sufficiently high value, i.e., a value $v_R$ corresponding to the abscissa of point R. It has been experimentally determined that the voltage $v_R$ is higher as the region I is thicker. The thinner the region I, the more important is the field prevailing therein for a given voltage, and consequently the more the ionization phenomenon will develop for a given voltage $v$. Conversely, if the region I is too thick, the ionization phenomenon calls for a higher voltage $v$ which might eventually destroy the semi-conductor.

Figure 6:
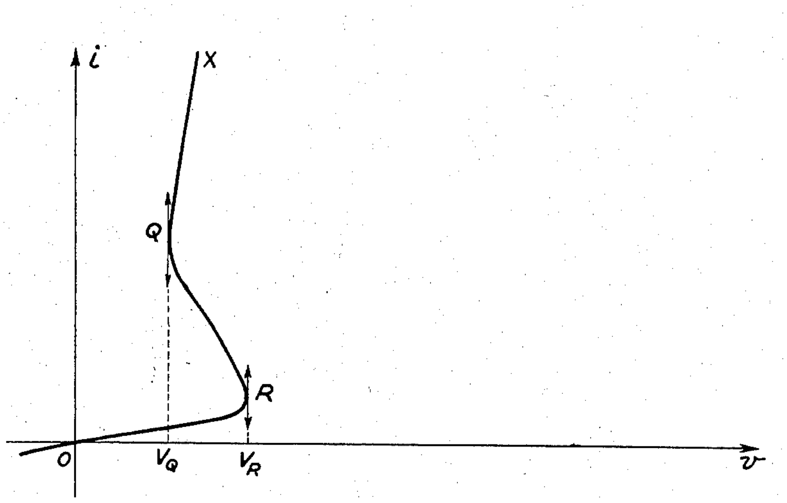
Figs. 4 and 6 show characteristic curves of a diode provided in accordance with the invention.

Fig. 4 shows the operating curve of a semi-conductor the ohmic resistance of the P region of which may be of the order of a few ohms or more. Fig. 6 is the same curve of a semi-conductor having a very low ohmic resistance in region P which may be of the order of a fraction of an ohm or less. In this latter case, the transition between regions RQ and QX is much more gradual. The portion OR of the characteristic curves has generally the same shape in both cases.

The operation is the same as in the case of Fig. 4.

Fig. 7 shows a modified embodiment of Fig. 5, for collecting ultra-high frequency oscillating energy of substantially higher frequency than in Fig. 5. It differs therefrom only in that a resonant circuit 19 is connected in parallel across the semi-conductor element. The resonant circuit possesses a resonant frequency higher than that of the fundamental oscillation of the semi-conductor substance.

The operation of this system may be explained as follows:

If there were no loss of energy in the resonant circuit 19, the latter would oscillate perpetually. This is of course not the case. However, the semi-conductor diode shows during a part of each of its oscillating cycles a negative dynamic resistance. Accordingly, if the Q-factor of the resonant circuit 19 is sufficiently high, the equivalent sum of both resistances is negative, i.e., the damping of the circuit is offset by the negative dynamic resistance of the semi-conductor at regular intervals. Circuit 19 will oscillate and it will be possible to collect energy therefrom. Circuit 19 should have a high Q-factor, for instance, of the order of 100. Ultra-high frequency oscillations of 3000 mcs. may thus be considered.

Figure 8:
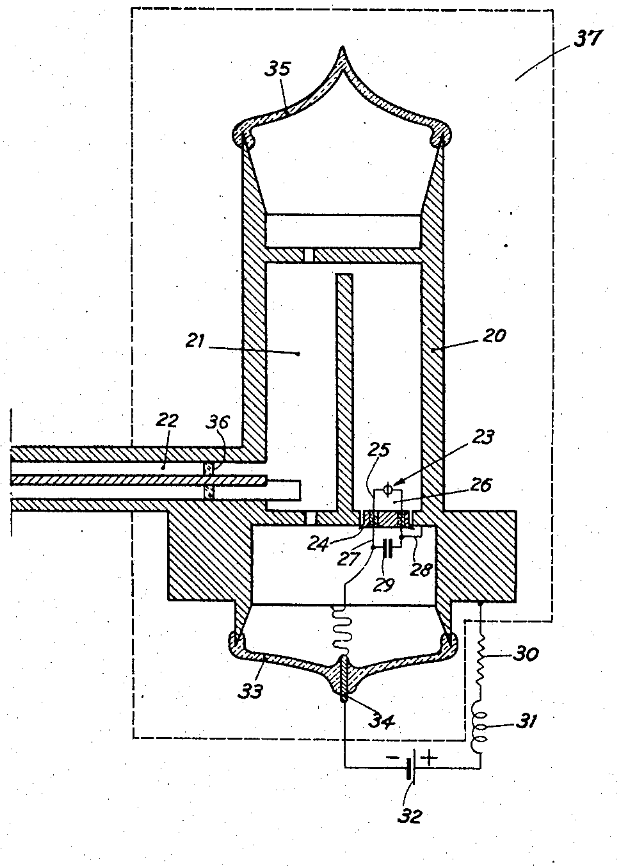
Fig. 8 is a further embodiment of the circuit illustrated in Fig. 7.

Fig. 8 illustrates a constructed embodiment of the device of Fig. 7. A metallic envelope 20, which may be evacuated and the ends of which may be closed with glass plugs 33 and 35 respectively constitutes a cavity resonator 21. It is provided with an output 22 for the ultra-high frequency energy. This output is closed by means of an air-tight plug 36. A semi-conductor diode 23 according to the invention is supported by metallic connections 25 and 26 which are insulated and carried by a plug 24, which closes an aperture provided in the wall of the envelope 20. A capacitor 29 is connected between extensions 27 and 28 of connections 25 and 26, and connection 28 is in electrical contact with envelope 20. An outside series circuit comprising a resistor 30, an inductance 31 and a D.C. voltage source 32, is connected to the envelope and to the extension 27 which extends at 34 through the base 33 of the tube. The whole of the device is immerged in a refrigerator 37 which is only diagrammatically shown.

It is to be understood that the invention is in no wise limited to the embodiments shown which are given solely by way of example.

In particular in the embodiments specified, semi-conductor substances other than germanium, for instance, silicon, indium-antimony alloy etc. may be used. As examples, silicon or indium antimonite may be used for the aforementioned intrinsic zones.

What I claim is:

1. An oscillating circuit comprising: a resistance; a voltage supply source; a semi-conductive junction diode including an intrinsic zone, a zone containing an excess of carriers of a predetermined charge, said intrinsic zone and said zone containing an excess of carriers constituting a junction having two external faces each carrying an ohmic contact; a heat insulated enclosure in which said diode is placed, said resistance, said voltage supply source and said diode being series connected, and a capacitor connected between said two ohmic contacts.

2. An oscillating circuit as claimed in claim 1, in which the thickness of said intrinsic zone is at most equal to 10 microns.

3. An oscillating circuit as claimed in claim 1, in which the resistance of said zone containing an excess of carriers of a predetermined charge is less than one ohm.

4. An oscillating circuit as claimed in claim 1, in which said zone containing an excess of carriers of a predetermined charge contains an excess of electrons.

5. An oscillating circuit as claimed in claim 1, in which said zone containing an excess of carriers of a predetermined charge contains an excess of holes.

6. An oscillating circuit as claimed in claim 1, in which said junction is composed of a wafer of intrinsic germanium having one face which contains impurities in the proportion of $10^{18}$ atoms of impurities per cubic centimeter.

7. An oscillating circuit as claimed in claim 1, in which said junction is composed of a wafer of intrinsic germanium having one face which contains atoms of indium.

8. An oscillating circuit as claimed in claim 1, in which said junction is composed of a wafer of intrinsic germanium having one face which contains atoms of antimony.

9. An oscillating circuit as claimed in claim 1, in which said intrinsic zone is silicium.

10. An oscillating circuit as claimed in claim 1, in which said intrinsic zone is indium antimonite.

11. An oscillating circuit comprising: a resistance; a voltage supply source; a semi-conductive junction diode including an intrinsic zone and a zone containing an excess of carriers of a predetermined charge, said junction diode having two external faces, and ohmic contacts supported on said faces; a heat insulated enclosure in which said diode is placed; said resistance, said voltage supply source and said diode being series connected; a capacitor; and a resonant circuit; said capacitor and said resonant circuit each being connected in parallel between said two homic contacts.

12. An oscillating circuit as claimed in claim 11, in which the thickness of said intrinsic zone is at most equal to 10 microns.

13. An oscillating circuit as claimed in claim 11, in which the resistance of said zone containing an excess of carriers of a predetermined sign is less than one ohm.

14. An oscillating circuit as claimed in claim 11, in which said zone containing an excess of carriers of a predetermined charge contains an excess of electrons.

15. An oscillating circuit as claimed in claim 11, in which said zone containing an excess of carriers of a predetermined charge contains an excess of holes.

16. An oscillating circuit as claimed in claim 11, in which said junction diode is composed of a wafer of intrinsic germanium having one face which contains impurities in the proportion of $10^{18}$ atoms of impurities per cubic centimeter.

17. An oscillating circuit as claimed in claim 11, in which said junction diode is composed of a wafer of intrinsic germanium having one face which contains atoms of indium.

18. An oscillating circuit as claimed in claim 11, in which said junction diode is composed of a wafer of intrinsic germanium having one face which contains atoms of antimony.

19. An oscillating circuit as claimed in claim 11, in which said intrinsic zone is silicium.

20. An oscillating circuit as claimed in claim 11, in which said intrinsic zone is indium antimonite.

21. An ultra-high frequency oscillating device comprising: a heat insulated enclosure, said enclosure containing: walls defining a cavity resonator having a first and a second end, the walls of said cavity resonator at said first end having two insulating portions; an output for the ultra high frequency oscillating energy; a semi-conducting structure comprising: an intrinsic zone, a zone containing an excess of carriers of a predetermined charge, said intrinsic zone and said zone containing an excess of carriers constituting a junction having two faces, each carrying an ohmic contact, said semi-conducting structure being inside said cavity resonator near said first end; a capacitor connected between said two ohmic contacts through said two insulating portions; and outside said heat insulated enclosure at least one resistance and terminal connections to said two ohmic contacts for connection of a voltage supply source.

22. An oscillator circuit arrangement of the type including a semi-conductor junction diode, a condenser connected in parallel with said diode, an adjustable resistance and a voltage supply source series connected with said diode, the values of said resistance and said voltage being so chosen that said diode has a negative resistance while the capacity of said condenser is so chosen that very high frequency oscillations take place therein, said arrangement comprising an additional parallel resonant high Q circuit connected across said diode and tuned to an ultra-high frequency, whereby ultra-high frequency oscillations are produced in said additional circuit, said junction diode including two contiguous zones formed of an intrinsic semi-conductor and a semi-conductor containing a proportion of impurities, respectively, and two purely ohmic conductors connected to said two zones respectively.

23. An oscillator circuit arrangement of the type including a semi-conductor junction diode, a condenser connected in parallel with said diode, an adjustable resistance and a voltage supply source series connected with said diode, the values of said resistance and said voltage being so chosen that said diode has a negative resistance while the capacity of said conductor is so chosen that very-high frequency oscillations take place therein, said arrangement comprising a cavity resonator coupled to said diode and tuned to an ultra-high frequency, whereby ultra-high frequency oscillations are produced in said cavity resonator, said junction diode including two contiguous zones formed of an intrinsic semi-conductor and a semi-conductor containing a proportion of impurities, respectively, and two purely ohmic conductors connected to said two zones, respectively.

24. An oscillator circuit arrangement as claimed in claim 23, wherein said junction diode is placed within said cavity resonator, the latter being enclosed in a heat insulating enclosure, said cavity resonator comprising an output for the ultra-high frequency energy produced therein.

25. An oscillator circuit arrangement as claimed in claim 23, wherein said intrinsic semi-conductor zone is less than ten microns thick and said impurities in the other zone are in the proportion of substantially $10^{18}$ atoms per cubic centimeter, the resistance of the last-mentioned zone being less than one ohm.

References Cited in the file of this patent

UNITED STATES PATENTS

| | | |
|---|---|---|
| 2,581,273 | Miller | Jan. 1, 1952 |
| 2,767,358 | Early | Oct. 16, 1956 |